US012489042B2

United States Patent
Leary et al.

(10) Patent No.: US 12,489,042 B2
(45) Date of Patent: Dec. 2, 2025

(54) DEVICE HAVING SOLDER BUMP STRUCTURE FOR IMPROVED MECHANICAL, ELECTRICAL, AND/OR THERMAL PERFORMANCE

(71) Applicant: Avago Technologies International Sales Pte. Limited, Singapore (SG)

(72) Inventors: Michael Leary, San Jose, CA (US); Ah Ron Lee, Seoul (KR); Chris Chung, Seoul (KR); Yonglk Choi, Seoul (KR); Domingo Figueredo, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/654,780

(22) Filed: May 3, 2024

(65) Prior Publication Data

US 2024/0290699 A1 Aug. 29, 2024

Related U.S. Application Data

(62) Division of application No. 17/536,298, filed on Nov. 29, 2021, now Pat. No. 12,002,741.

(Continued)

(51) Int. Cl.
*H01L 23/498* (2006.01)
*H01L 21/48* (2006.01)
*H01L 23/00* (2006.01)

(52) U.S. Cl.
CPC .... *H01L 23/49816* (2013.01); *H01L 21/4853* (2013.01); *H01L 23/49838* (2013.01);
(Continued)

(58) Field of Classification Search
CPC ......... H01L 23/49816; H01L 23/49822; H01L 23/49838
See application file for complete search history.

(56) References Cited

U.S. PATENT DOCUMENTS

| 5,796,169 A | 8/1998 | Dockerty et al. |
| 2009/0267217 A1 | 10/2009 | Kuwabara |

(Continued)

FOREIGN PATENT DOCUMENTS

| CN | 1182957 A | 5/1998 |
| CN | 1983581 A | 6/2007 |

(Continued)

OTHER PUBLICATIONS

European Search Report on EP 22184403.8 dated Dec. 14, 2022.
(Continued)

*Primary Examiner* — Michael Jung
(74) *Attorney, Agent, or Firm* — Foley & Lardner LLP

(57) ABSTRACT

In some aspects, the disclosure is directed a module for improving mechanical, electrical, or thermal performance. In some embodiments, the module includes a bottom surface, a side surface, a first solder bump disposed on the bottom surface, and a second solder bump disposed on the bottom surface. In some embodiments, the bottom surface extends in a first lateral direction and a second lateral direction perpendicular to the first lateral direction. In some embodiments, the side surface extends in a vertical direction perpendicular to the first lateral direction and the second lateral direction. In some embodiments, the second solder bump is adjacent to the side surface. In some embodiments, the first solder bump has a first length in the first lateral direction. In some embodiments, the second solder bump (Continued)

has a second length in the first lateral direction. In some embodiments, the first length is greater than the second length.

19 Claims, 7 Drawing Sheets

Related U.S. Application Data

(60) Provisional application No. 63/272,994, filed on Oct. 28, 2021, provisional application No. 63/221,564, filed on Jul. 14, 2021.

(52) U.S. Cl.
CPC ........ *H01L 23/49822* (2013.01); *H01L 24/16* (2013.01); *H01L 2224/16227* (2013.01)

(56) References Cited

U.S. PATENT DOCUMENTS

| | | |
|---|---|---|
| 2010/0289104 A1 | 11/2010 | Ra et al. |
| 2014/0146505 A1 | 5/2014 | Su et al. |
| 2015/0206832 A1 | 7/2015 | Kudo |
| 2016/0329292 A1 | 11/2016 | Marbella |
| 2018/0240778 A1 | 8/2018 | Liu et al. |
| 2019/0006306 A1 | 1/2019 | Shibata et al. |
| 2019/0035754 A1 | 1/2019 | Uesaka |
| 2020/0111731 A1 | 4/2020 | Ishikawa et al. |
| 2020/0203299 A1 | 6/2020 | Huang et al. |
| 2021/0057317 A1 | 2/2021 | Park et al. |
| 2022/0165680 A1* | 5/2022 | Kim ................. H01L 23/552 |
| 2022/0375882 A1* | 11/2022 | Darmawikarta ........ H01F 17/04 |
| 2023/0081139 A1* | 3/2023 | Valavala ............... H01L 25/105 257/776 |
| 2023/0290710 A1* | 9/2023 | Hosokawa ........ H01L 23/49838 |

FOREIGN PATENT DOCUMENTS

| | | |
|---|---|---|
| CN | 104952746 A | 9/2015 |
| CN | 210167352 U | 3/2020 |
| WO | WO-2020/168552 A1 | 8/2020 |

OTHER PUBLICATIONS

Non-Final Office Action on U.S. Appl. No. 17/536,298 DTD Oct. 13, 2023.

Notice of Allowance on U.S. Appl. No. 17/536,298 DTD Feb. 2, 2024.

Chinese Office Action on CN Appln. No. 202210817157.8 dated Feb. 28, 2025.

* cited by examiner

330

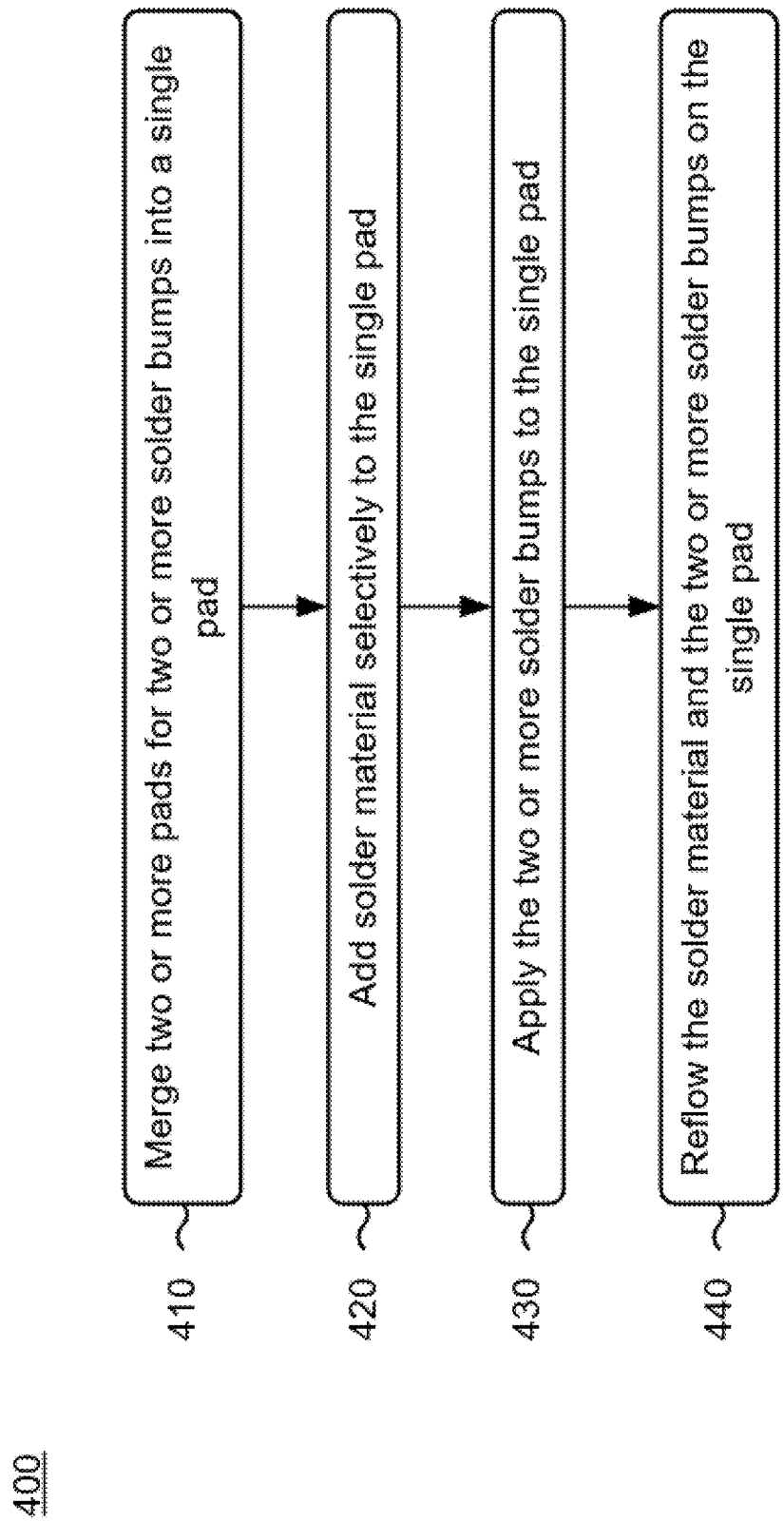

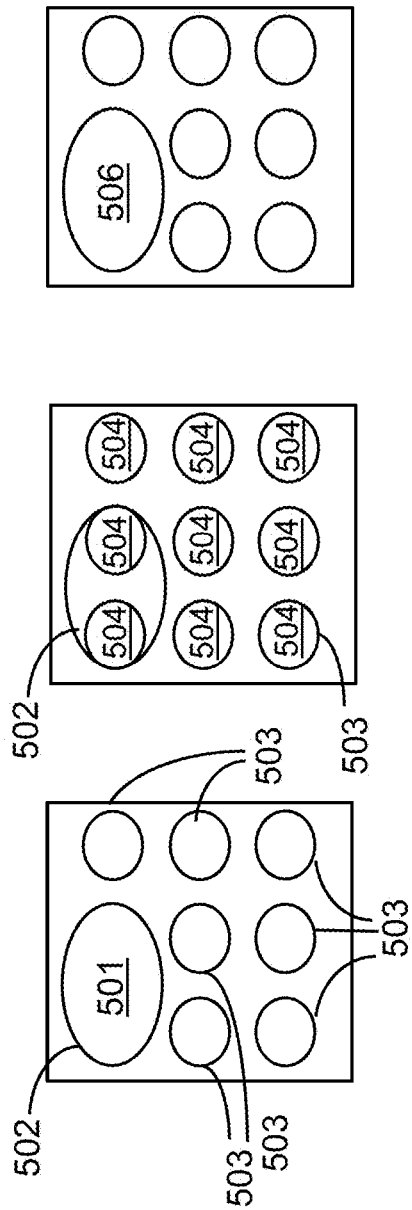

DEVICE HAVING SOLDER BUMP STRUCTURE FOR IMPROVED MECHANICAL, ELECTRICAL, AND/OR THERMAL PERFORMANCE

CROSS-REFERENCE TO RELATED APPLICATIONS

This application is a divisional of U.S. patent application Ser. No. 17/536,298, filed Nov. 29, 2021, which claims the benefit of and priority under 35 U.S. § 119(e) to U.S. Provisional Patent Application No. 63/272,994, filed Oct. 28, 2021, titled "STRUCTURE TO IMPROVE MECHANICAL, ELECTRICAL, AND THERMAL PERFORMANCE," and U.S. Provisional Patent Application No. 63/221,564, filed Jul. 14, 2021, titled "STRUCTURE TO IMPROVE MECHANICAL, ELECTRICAL, AND THERMAL PERFORMANCE," the entire disclosures of which are incorporated by reference herein.

BACKGROUND OF THE DISCLOSURE

Semiconductor packages with electronic components are common for operating compact consumer devices such as mobile phones, personal computer, tablets, etc. Many packages often include a substrate having both passive circuit components and active circuit components, such as Integrated Circuit (IC) chips, connected thereto.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 4 illustrates a flow of operations for providing customized bumps on a module, in accordance with some embodiments.

FIG. 5A is top planar view schematic drawings of a circuit board including solder material on a single pad, in accordance with some embodiments.

FIG. 5B is top planar view schematic drawings of a circuit board including solder material and two solder bumps on a single pad, in accordance with some embodiments.

FIG. 5C is top planar view schematic drawings of a circuit board including a custom sized solder bump, in accordance with some embodiments.

Figure 1:
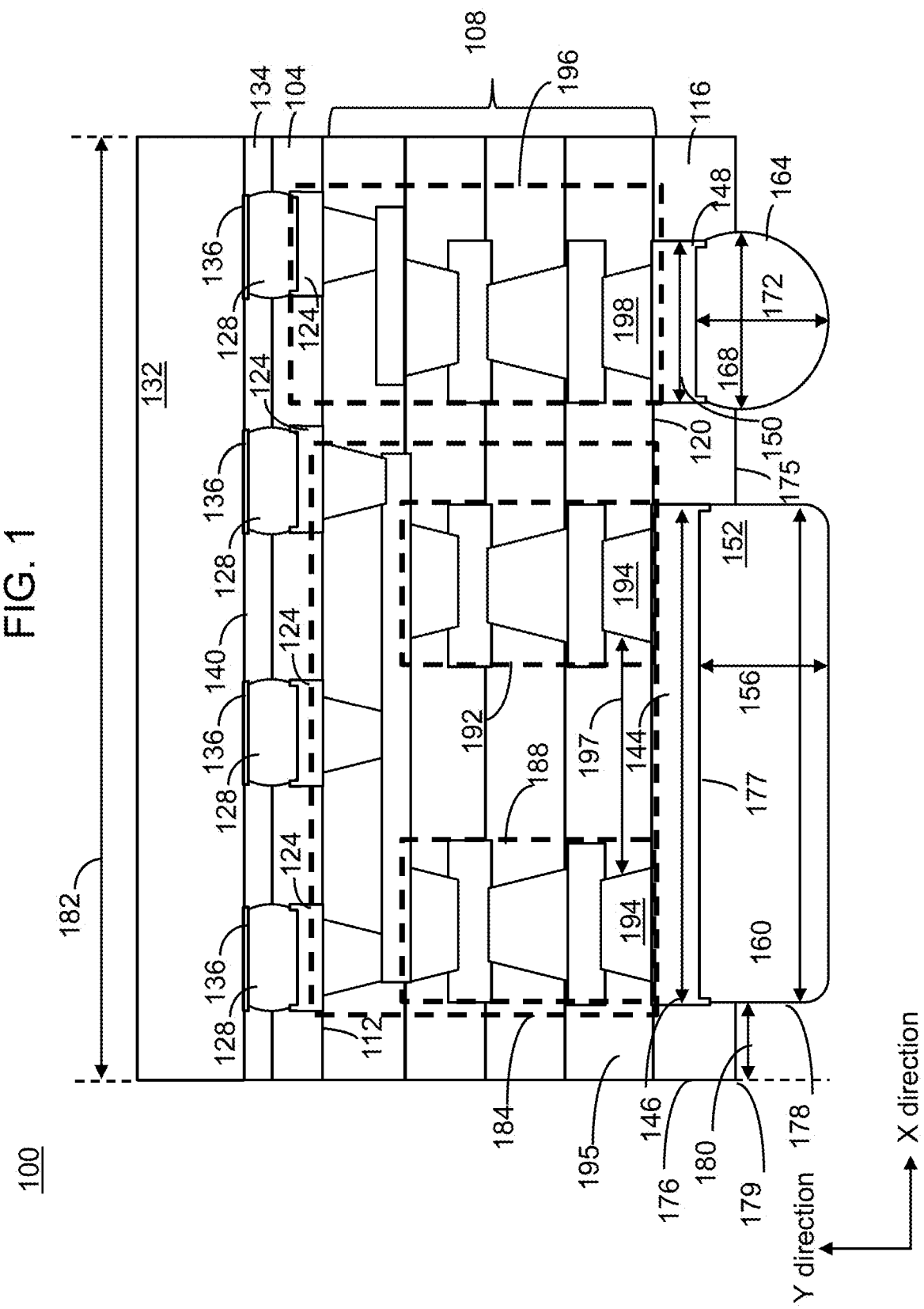
FIG. 1 is a cross-sectional view schematic drawing of a module, in accordance with some embodiments of the present disclosure.

The details of various embodiments of the methods and systems are set forth in the accompanying drawings and the description below.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Semiconductor packages with electronic components are common for operating compact consumer devices such as mobile phones, personal computer, tablets, etc. Many packages may include a substrate having both passive circuit components and active circuit components, such as Integrated Circuit (IC) chips, connected thereto. The substrate may be connectable to a larger circuit board via one or a series solder balls. The solder balls, especially at edges and corners of the substrate, may be subject to stress-induced cracks when exposed to external forces such as high-gravitational forces imparted when dropped. The term package includes packages including but not limited to a single active component, more than one active component, (e.g., a multi-chip module or heterogeneous package), and any combination of one or more active components and one or more passive components.

Size reduction of packages and components provided or used in an electronic device (e.g., smartphone, tablet, wearable, computer, sensor, access point, radio, network component, storage device, etc.) can be accomplished by placing some of the IC chips and passive circuit components on the back side of the package. This type of configuration can reduce a module size and a corresponding number of solder balls on the back side of the package, which may make the package more susceptible to damage induced by mechanical stress (e.g., shock, strain, force). This susceptibility can be increased primarily because there may be fewer solder balls available to accommodate the same mechanical stress as a package with more solder balls. Thus, similar stress may be placed on a fewer number of solder balls, thereby concentrating the stress through the remaining solder balls. The stress may peak at the corner bumps during mechanical deformation or warpage. Removing bumps along the edge of the module can further decrease module size at the risk of increased peak stress for the corner bumps.

Solder balls may be designed such that stress concentration points exist where the solder ball interfaces with a printed circuit board (PCB), a metal trace of a PCB, and/or a solder pad of a PCB. The stress concentration point may be created because of the shape taken by the solder material during deposition or attachment of the solder material to the PCB, metal trace, and/or solder pad. The natural shape taken by the solder material can create a relatively "sharp" angle (e.g., a nearly orthogonal angle) at the interface between the solder material and the PCB. This may become a point of failure in a package having fewer solder balls than packages with evenly distributed solder balls, more densely distributed solder balls, or a conventional full set of solder balls.

Some embodiments of the present disclosure address, mitigate and/or solve challenges associated with stress. In some embodiments, a module includes non-uniformly sized bumps (e.g., a set of smaller bumps and a set of larger bumps) on a surface of the module. For example, corner bumps may be larger than other bumps. The larger bumps may have a certain shape (e.g., oval-shaped, rectangular-shaped, diamond shaped, and/or L-shaped). The bumps reduce mechanical stress and improve thermal and electrical conductivity in some embodiments.

Applications may include RF and wireless applications such as mobile handsets. Additionally or alternatively, applications may include millimeter wave, optical, telematics (automotive), aeronautic electronics, or any application where products require high mechanical, electrical, or thermal robustness.

Various embodiments disclosed herein are related to a module. In some embodiments, the module includes a bottom surface, a side surface, a first solder bump disposed on the bottom surface, and a second solder bump disposed on the bottom surface. In some embodiments, the bottom surface extends in a first lateral direction and a second lateral direction perpendicular to the first lateral direction. In some embodiments, the side surface extends in a vertical direction perpendicular to the first lateral direction and the second lateral direction. In some embodiments, the second solder bump is adjacent to the side surface. In some embodiments, the first solder bump has a first length in the first lateral direction. In some embodiments, the second solder bump has a second length in the first lateral direction. In some embodiments, the first length is greater than the second length. In some embodiments, the first length is at least two times the second length.

In some embodiments, the first solder bump is one or more of oval-shaped, rectangular shaped, or L-shaped. In some embodiments, the module includes a first edge, a second edge opposite the first edge, and a first distance from the first edge to the second edge, and wherein the first solder bump is a second distance from the first edge, wherein the second distance is less than 5% of the first distance.

In some embodiments, a first component disposed on the bottom surface and a second component disposed on the bottom surface. In some embodiments, the first component and the second component are spaced from each other by a distance less than two times the second length. In some embodiments, the first solder bump is disposed in between the first component and the second component In some embodiments, the first solder bump has a first height in a vertical direction perpendicular to the first lateral direction and the second lateral direction. In some embodiments, the second solder bump has a second height in the vertical direction. In some embodiments, the first height is equal to the second height.

In some embodiments, the module includes a first via extending in a vertical direction to contact a first portion of the first solder bump a second via extending along the vertical direction to contact a second portion of the first solder bump. In some embodiments, the first via is separated from the second via by a distance in the first lateral direction. In some embodiments, the vertical direction is perpendicular to the first lateral direction and the second lateral direction.

In some embodiments, the module includes a first pad disposed in between the bottom surface and the first solder bump, and a second pad disposed in between the bottom surface and the second solder bump. In some embodiments, the first pad has a third length in the first lateral direction, the second pad has a fourth length in the first lateral direction, and the third length is greater than the second length.

In some embodiments, the module includes a first component disposed on the bottom surface further, and a top surface opposite the bottom surface. In some embodiments, a silicon die is disposed on the top surface. In some embodiments, the module includes a first conductive structure electrically coupling the first solder bump to the silicon die, and a second conductive structure electrically coupling the second solder bump to the silicon die.

Various embodiments disclosed herein are related to a chipset. In some embodiments, the chipset includes a printed circuit board (PCB) including a first surface extending in a first lateral direction and a second lateral direction perpendicular to the first lateral direction. In some embodiments, the chipset includes a module including a second surface extending in the first lateral direction and the second lateral direction, and a solder bump disposed between the first surface and the second surface. In some embodiments, the solder bump is one or more of oval-shaped, rectangular shaped, or L-shaped. In some embodiments, the second surface is disposed over the first surface. In some embodiments, an air gap is disposed in between the first surface and the second surface.

In some embodiments, the module includes a first edge, a second edge opposite the first edge, and a first distance from the first edge to the second edge. In some embodiments, the solder bump is a second distance from the first edge. In some embodiments, the second distance is less than 5% of the first distance. In some embodiments, no intervening solder bump is in between the first edge and the solder bump.

In some embodiments, the module includes a second solder bump disposed between the first surface and the second surface. In some embodiments, the solder bump has a length in the first lateral direction. In some embodiments, the second solder bump has a diameter in the first lateral direction. In some embodiments, the length is greater than the diameter. In some embodiments, the solder bump has a first height in a vertical direction perpendicular to the first lateral direction and the second lateral direction. In some embodiments, the second solder bump has a second height in the vertical direction. In some embodiments, the first height is equal to the second height.

Various embodiments disclosed herein are related to a chipset. The method includes merging a first pad for a first solder bump and a second pad for a second solder bump into a single pad for two solder bumps, adding solder material to the single pad, applying the two solder bumps, and reflowing the solder material and the two or more solder bumps to produce a custom sized solder bump.

In some embodiments, pads include the single pad and additional pads. In some embodiments, adding solder material to the single pad includes placing a stencil over the plurality of pads. In some embodiments, the stencil includes an opening exposing the single pad. In some embodiments, adding solder material to the single pad includes applying solder to the single pad exposed by the opening. In some embodiments, adding solder material to the single pad includes three-dimensional (3D) printing the solder material. In some embodiments, the method includes removing a portion of the custom sized solder bump using laser ablation.

FIG. 1 illustrates a cross-sectional view of a module 100, in accordance with some embodiments of the present disclosure. The module 100 may be referred to as a package. The module 100 includes a first layer 104, a number of middle layers 108 disposed on (e.g., in contact with, vertically adjacent to, etc.) a first (e.g., lower, bottom, etc.) surface 112 of the first layer, and a second layer 116 disposed on a first (e.g., lower, bottom, etc.) surface 120 of the middle layers 108. In the cross-section view, the first surface 112 and the first surface 120 extend in a first direction (e.g., X direction, laterally, etc.).

The first layer 104 includes a number of first pads 124 (e.g., contact pads, footprints). The module 100 includes a number of first solder bumps 128. Each of the first solder bumps 128 is disposed on a respective one of the first pads 124. Each of the first solder bumps 128 may be formed into a solder ball or other circular or spherical shape. In some embodiments, each of the solder bumps 128 has a length (e.g., diameter) of approximately (e.g., in a range of) 25 um to 125 um, although any length values are within the scope of the disclosure. Each of the first solder bumps 128 may include, but is not limited to, a lead alloy solder, a lead-free solder, a silver alloy solder, or any material that adheres one of a module, a silicon die, a passive component, or PCB to a second one of a module, a silicon die, a passive component, or PCB.

The module 100 includes a silicon die 132 disposed on the number of first solder bumps 128. The silicon die includes a number of second pads 136 and each of the second pads 136 is disposed in between a respective one of the first solder bumps 128 and a first (e.g., lower, bottom, etc.) surface 140 of the silicon die 132. In the cross-section view, the first surface 140 extends in the first direction. Although four first solder bumps 128, first pads 124, and second pads 136 are shown, a greater or less number of first solder bumps 128, first pads 124, and second pads 136 are within the scope of the disclosure.

The module 100 includes an underfill (UF) layer 134 disposed in between the first layer 104 and the silicon die 132. The UF layer 134 may protect bonding of the silicon die 132 bonds to the first solder bumps 128. The UF layer 134 may include a dielectric material.

The second layer 116 includes a number of third pads 144 and a number of fourth pads 148. Each of the third pads 144 includes a length 146. Each of the fourth pads includes a length 150. The length 146 is greater than the length 150. For example, the length 146 may be at least two times, three times, or four times greater than the length 150, although any ratio of the length 146 and the length 150 is within the scope of the disclosure. In some embodiments, each of the third pads 144 is a single conductive structure (e.g., including a uniform conductive material), whereas in other embodiments, each of the third pads 144 is a set of multiple pads with a space (e.g., dielectric material) between the each of the multiple pads. In some embodiments, each of the third pads 144, the fourth pads 148, the first pads 124, and the second pads 136 include a conductive material.

The module 100 includes a number of second solder bumps 152. Each of the second solder bumps 152 is disposed on a respective one of the third pads 144. Each of the second solder bumps 152 includes a height 156 and a length 160. In some embodiments, the length 160 is approximately 150 um to 600 um, although any length values are within the scope of the disclosure. Each of the second solder bumps 152 may include a same material as each of the first solder bumps 128. Although one second solder bump 152, one third pad 144, one third solder bump 164, and one fourth pad 148 are shown, a greater number of each of the second solder bumps 152, the third pads 144, the third solder bumps 164, and the fourth pads 148 are within the scope of the disclosure.

The module 100 includes a number of third solder bumps 164. Each of the third solder bumps 164 is disposed on a respective one of the fourth pads 148. Each of the third solder bumps 164 includes a length (e.g., diameter) 168 and a height 172. Each of the third solder bumps 164 may be similar to each of the first solder bumps 128 except that each of the third solder bumps 164 has a length of approximately 100 um to 250 um, although any length values are within the scope of the disclosure. In some embodiments, there are no solder bumps disposed on the second layer 116 (e.g., disposed on pads in, or associated with, the second layer 116) that have a length smaller than the length 168.

Each of the second solder bumps 152 may be larger than each of the third solder bumps 164. In some embodiments, the length 160 of one of the second solder bumps 152 is greater than the length 168. For example, the length 160 may be at least two times, three times, or four times greater than the length 168, although any ratio of the length 160 and the length 168 is within the scope of the disclosure. A height 156 of each of the second solder bumps 152 may be equal, or substantially equal, to height 172 of each of the third solder bumps 164. Including the second solder bumps 152 in the module 100 may improve electrical, mechanical, and/or thermal integrity/performance compared to including more instances of the third solder bumps 164 in place of the second solder bumps 152.

The second layer 116 includes a first (e.g., bottom) surface 175. The third pads 144 include a first (e.g., bottom surface) 177. In some embodiments, the first surface 175 aligns with (e.g., flat with, no recess, etc.) the first surface 177, whereas in other embodiments, the first surface 177 is recessed with respect to the first surface 175. The first surface 175 and the first surface 177 may be referred to as a (e.g., single, uniform, etc.) surface.

The second layer 116 includes a second (e.g., side) surface 176. In the cross-section view, the second surface 176 extends in a second direction (e.g., Y direction, vertically, etc.) perpendicular to the first direction. In some embodiments, the second surface 176 coincides with the first surface 175 to form an edge 179 (e.g., the edge 179 couples the first surface 175 and the second surface 176). In some embodiments, one of the second solder bumps 152 is adjacent (e.g., nearest) to the second surface 176 (e.g., the edge 179). That is, in some embodiments, there is no (e.g., intervening) solder bump disposed in between one of the second solder bumps 152 and the second surface 176.

One of the solder bumps 152 has a first surface 178 that extends in the second direction. The second surface 176 (e.g., the edge 179) and the first surface 178 are separated, in the first direction, by a first distance 180. In some embodiments, the distance 180 is less than the length 168 of each of the third solder bumps 164 (e.g., such that any of the third solder bump 164, or any other solder bump with a length less than that of each of the second solder bumps 152, cannot be disposed in between one of the second solder bumps 152 and the second surface 176). The distance 180 from the first surface 178 to the second surface 176 may be less than a predetermined distance, percentage of a distance, or ratio of distances. For example, the distance 180 may be less than 10%, 5%, or 2.5% of a length 182 of the module 100 in the first direction, although any distance, percentage of a distance, or ratio of distances is within the scope of the disclosure.

The middle layers 108 include a conductive structure 184 that electrically couples at least one of the first pads 124 to at least one of the third pads 144. The conductive structure 184 can include copper (Cu), aluminum (Al), cobalt (Co), ruthenium (Ru), Tungsten (W), or any of other various conductive materials. In some embodiments, the conductive structure 184 includes a first conductive structure 188 that is disposed on a first portion of one of the third pads 144 and a second conductive structure 192 is disposed on a second portion of the one of the third pads 144.

In some embodiments, each of the first conductive structure 188 and the conductive structure 192 include a via 194 disposed on the respective portion of the one of the third pads 144. In some embodiments, each via 194 is in the layer 195 of the middle layers 108. In some embodiments, the via 194 of the first conductive structure 188 is electrically coupled to the via 194 of the second conductive structure 192 through the one of the third pads 144 but not through any other conductive material in the layer 195. In some embodiments, the via 194 (e.g., a center of the via, a midpoint of the edge of the via, a widest point of the edge of the via, etc.) of the first conductive structure 188 is electrically coupled to the via 194 of the second conductive structure 192 are separated by a distance 197.

The middle layers 108 include a conductive structure 196 that is disposed on one of the fourth pads 148. In some embodiments, the conductive structure 196 includes a same material as the conductive structure 184. In some embodiments, the conductive structure 196 is electrically coupled to the first conductive structure 188 and the second conductive structure 192, while in other embodiments, the conductive structure 196 is not electrically coupled to (e.g., electrically isolated from) the first conductive structure 188 and the second conductive structure 192. In some embodiments, a first portion of the middle layers 108 in between the first conductive structure 188 and the second conductive structure 192, as well as second portion of the middle layers 108 between the conductive structure 184 and the conductive structure 196, includes a dielectric material.

In some embodiments, the conductive structure 196 includes a via 198 disposed on one of the fourth pads 148. In some embodiments, a length (e.g., a diameter), height, and clearance of the via 198 is same as a length, height, and clearance of the via 194, wherein the length of each via in the first direction and the height and clearance of each via is in the second direction, and wherein the clearance is a distance between the via and the nearest adjacent via. In some embodiments, a number of the vias 194 disposed over the one of the third pads 144 is greater than a number of the vias 198 disposed over the one of the fourth pads 148.

Figure 2:
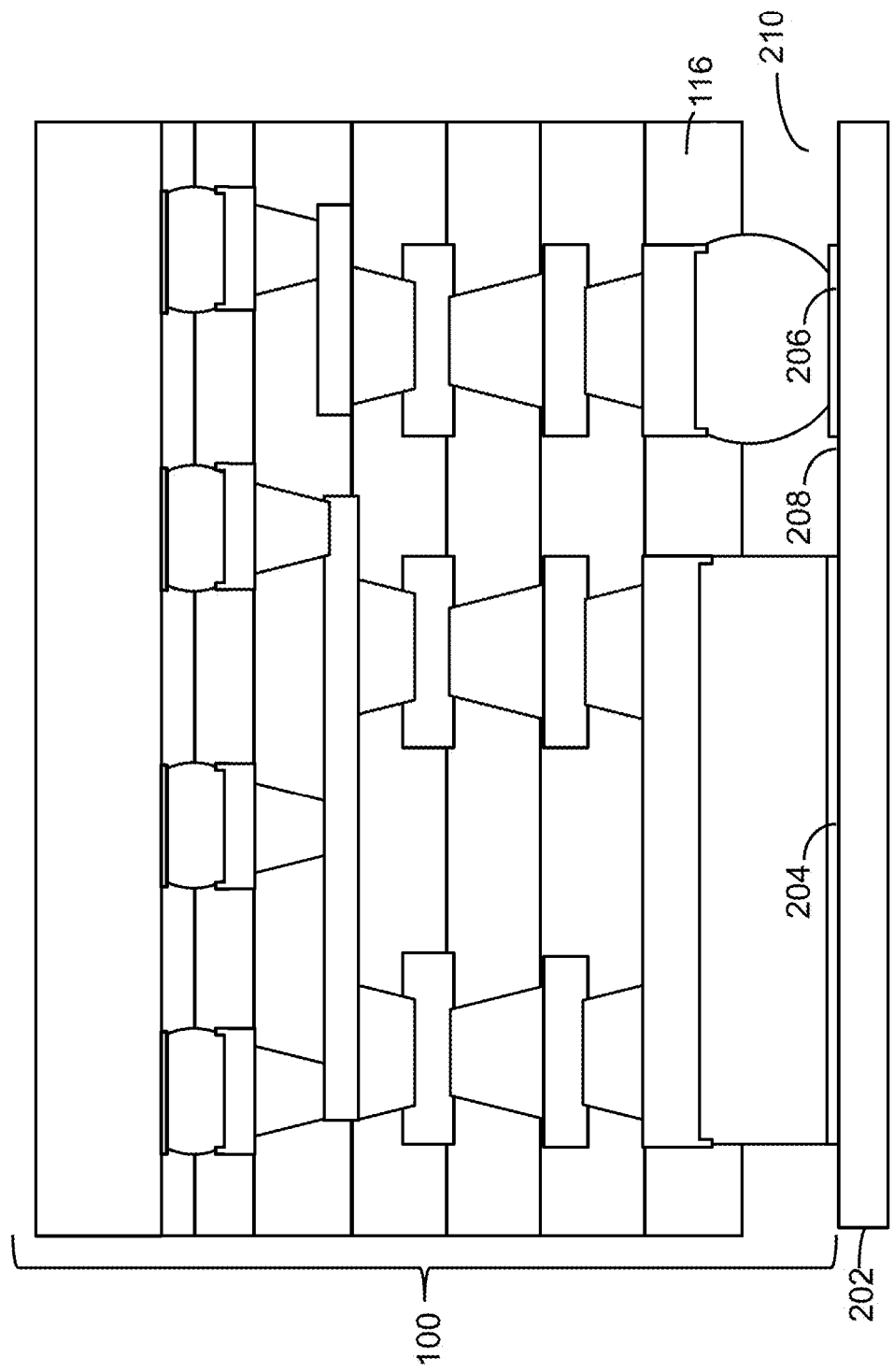
FIG. 2 illustrates is a cross-sectional view schematic drawing of a chipset, in accordance with some embodiments of the present disclosure.

FIG. 2 illustrates a cross-sectional view of a chipset 200, in accordance with some embodiments of the present disclosure. The chipset 200 includes the module 100 and a printed circuit board (PCB) 202 (e.g., customer PCB, motherboard, interface board, test kit board) coupled to the module 100. The PCB 202 includes a number of first pads 204 disposed and a number of second pads 206. The first pads 204 and the second pads 206 are disposed on a first surface 208 of the PCB 202, wherein the first (e.g., upper, top, etc.) surface 208 extends in the first direction. Each of the second solder bumps 152 are disposed on a respective one of the first pads 204 and each of the third solder bumps 164 are disposed on a respective one of the second pads 206.

In some embodiments, an air gap 210 (e.g., a cavity, air, etc.) is disposed in between the PCB 202 and the second layer 116 of the module 100. In some embodiments, a UF layer such as the UF layer 134 is not disposed in between the PCB 202 and the second layer 116 of the module 100. UF can be expensive and can negatively impact neighboring devices. UF can increase dielectric losses. UF may extend to neighboring devices on the mother board causing undesired effects. For ultra-high frequency applications, adding UF can change degrade the frequency response of the device and increases assembly complexity and cost. UF can carry low halogen content which can cause electrochemically induced corrosion. In some embodiments, having the air gap 210 (instead of UF) between the module 100 and the PCB 202 improves assembly efficiency and high-frequency performance, although other improvements are within the scope of the disclosure.

Figure 3A:
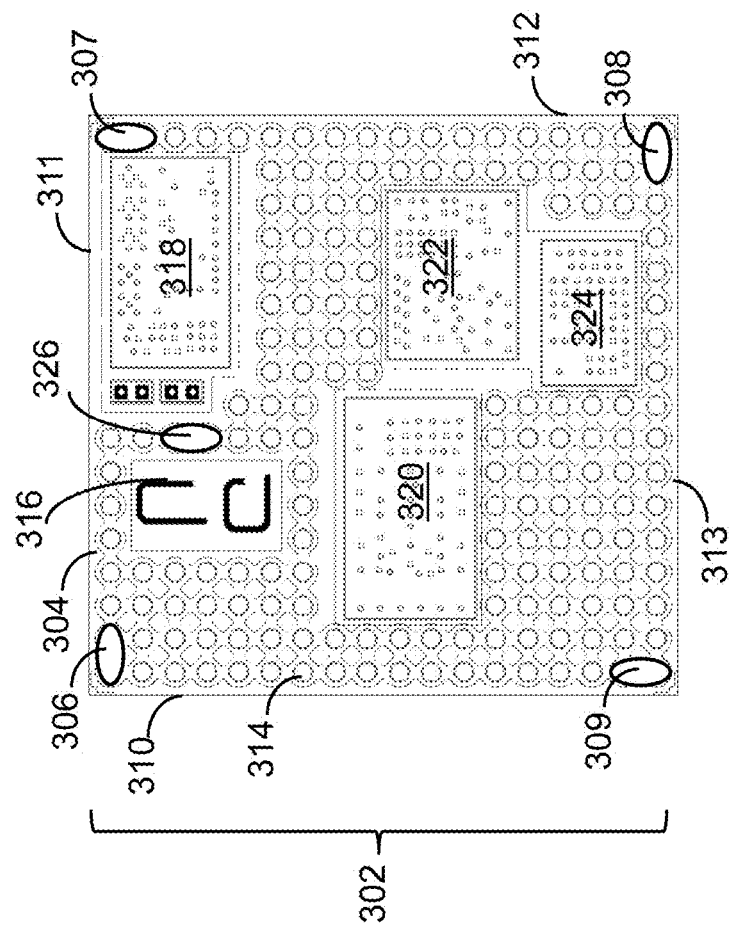
FIGS. 3A-3C are top planar view schematic drawings of various modules, in accordance with some embodiments of the present disclosure.

FIG. 3A illustrates a top-down view of a module 300, in accordance with some embodiments of the present disclosure. The module 300 includes a plurality of bumps 302 disposed on a surface 304 of the module 300. The plurality of bumps 302 is arranged as an array of rows extending in the first lateral direction and columns extending in the second lateral direction.

The plurality of bumps 302 includes a solder bump 306, a solder bump 307, a solder bump 308, a solder bump 309, and a number of solder bumps 314. Each of the solder bumps 306-309 is similar to the second solder bump 152 of FIG. 1. Each of the solder bumps 314 is similar to the third solder bump 164 of FIG. 1. Each of the solder bumps 306-309 occupy an area that would otherwise be occupied by two of the solder bumps 314. In other words, each of the solder bumps 306-309 extends across at least two rows or two columns. For example, the solder bump 306 extends across two columns, the solder bump 307 extends across two rows, the solder bump 308 extends across two columns, and the solder bump 309 extends across two rows.

Each of the solder bumps 306-309 are disposed on a corner portion of the surface of the module 100. Specifically, the solder bump 306 is within a first distance from the edge 310 of the module 300 and within the first distance from the edge 311 of the module 300, the solder bump 307 is within the first distance from the edge 311 of the module 300 and within the first distance from the edge 312 of the module 300, the solder bump 308 is within the first distance from the edge 312 of the module 300 and within the first distance from the edge 313 of the module 300, and the solder bump 309 is within the first distance from the edge 313 of the module 300 and within the first distance from the edge 310 of the module 300. In some embodiments, the first distance may be the same as the first distance 180 of FIG. 1. Each of the solder bumps 306-309 occupies an intersection of a row and column that is nearest a corner of the module 100. In some embodiments, the solder bumps 306-309 can provide additional mechanical strength.

The module 300 includes a number of components (e.g., silicon components, silicon dies, etc.) disposed on the surface 304. The number of components includes component 316, component 318, component 320, component 322, and component 324. Although five components are shown in FIG. 3, a greater or fewer number of components included in the module 300 is within the scope of the disclosure. In some embodiments, the module 300 may be a double-sided module. In other words, at least one component is disposed on a second surface (not shown) opposite the surface 304. The at least one component may be similar to the silicon die of 132.

Some of the components may be separated by only one row or one column of solder bumps. For example, components 316 and 318 are separated by only one column of solder bumps. In some embodiments, a distance between component 316 and component 318 is less than two times the length (e.g., length 168 of FIG. 1) of one of the solder bumps 314 (e.g., such that only one column of solder bumps can be disposed in between the component 316 and the component 318). The module 300 includes a solder bump 326 in disposed in between the components 316 and 318. In some embodiments, the solder bump 326 is similar to the second solder bump 152 of FIG. 1. The solder bump 326 extends along the column separating the components 316 and 318. In some embodiments, the solder bump 326 improves electrical isolation between the components 316 and 318.

Figure 3B:
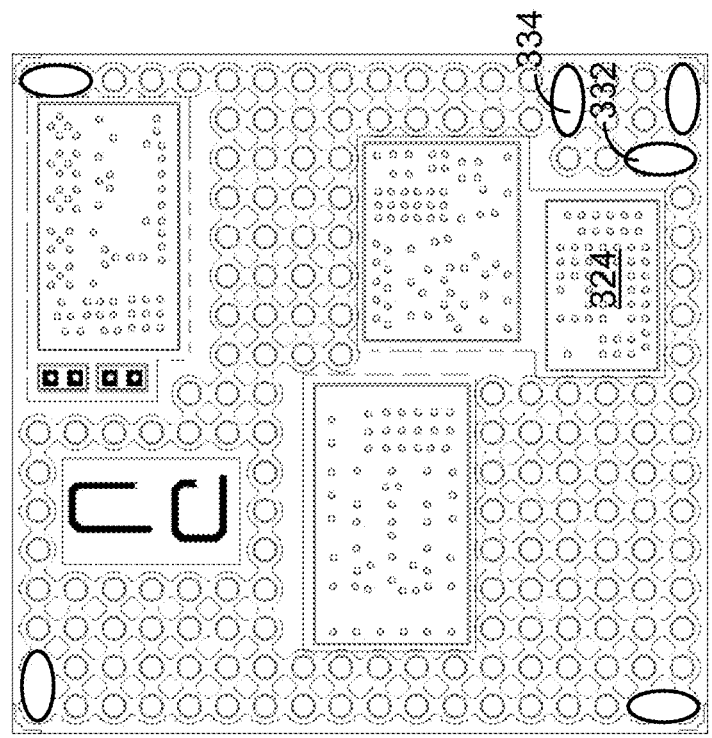

FIG. 3B illustrates a top-down view of a module 330, in accordance with some embodiments of the present disclosure. In some embodiments, the module 330 is similar to the module 300 of FIG. 3A except that the module 330 includes solder bump 332 and solder bump 334. Each of the solder bumps 332-334 is similar to the second solder bump 152 of FIG. 1. Each of the solder bumps 332-334 may be within a predetermined distance of a component. For example, the solder bump 332 is in a column next to (e.g., one column away from, on a same row) the component 324 and the solder bump 332 is in a second column that is two columns away from and on a same row as the component 324. In some embodiments, a distance between the solder bump 332 and the component 324 is less than 2.5%, 5%, or 10% of a length of the module 330 (e.g., the length 182). In some embodiments, each of the solder bumps 332-334 are electrically coupled to a reference (e.g., ground, a ground plane, etc.). In some embodiments, the reference is coupled to the component 324. The solder bumps 332-334 may improve thermal dissipation of the component 324.

Figure 3C:
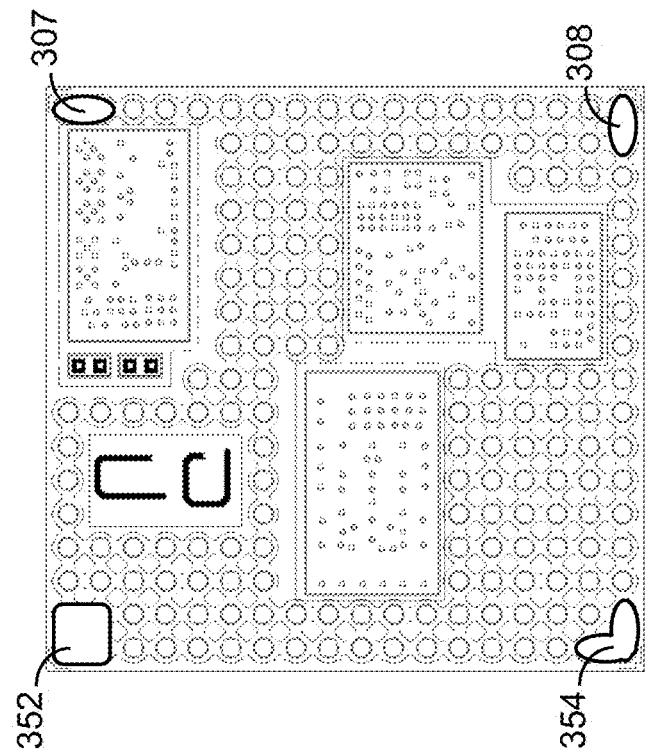

FIG. 3C illustrates a top-down view of a module 350, in accordance with some embodiments of the present disclosure. In some embodiments, the module 330 is similar to the module 300 of FIG. 3A except that the module 350 includes solder bump 352 instead of solder bump 306 and solder bump 354 instead of solder bump 309. Each of the solder bumps 352-354 is similar to the solder bumps 306-309 except that the solder bumps 306-309 are oval-shaped (e.g., as illustrated in the top-down view of FIG. 1A and FIG. 1C), the solder bump 352 is square-shaped (e.g., as illustrated in the top-down view of FIG. 1C), and the solder bump 354 is L-shaped (e.g., as illustrated in the top-down view of FIG. 1C).

The solder bump 352 occupies an area that would otherwise be occupied by four of the solder bumps 314 (e.g., a 2×2 array of solder bumps 314). The solder bump 354 occupies an area that would otherwise be occupied by three of the solder bumps 314 (e.g., a column of two solder bumps 314 and an adjacent column of one solder bump 314 in a same row as one of the two solder bumps 314). Although the module 350 includes oval-shaped, square-shaped, and L-shaped solder bumps, solder bumps can be any of various shapes while remaining within the scope of the disclosure.

FIG. 4 illustrates a method 400 for providing customized bumps on a module, in accordance with some embodiments. Additional, fewer, or different operations may be performed in the method 400 depending on the embodiment.

In brief overview, the method 400 includes merging two or more pads for two or more solder bumps into a single pad (at operation 410), adding solder selectively to the single pad (at operation 420), applying solder bumps to all of the pads (at operation 430), and reflowing the single pad (at operation 440).

In greater detail, at operation 410, the method begins by merging two or more pads for (e.g., corresponding to, associated with) two or more solder bumps to produce a single pad such as the third pad 144 of FIG. 1. The single pad is a pad on which a customized/specially shaped solder bump may be disposed by way of the remaining operations. In some embodiments, the two or more pads are at a corner of a module such as the module 300 of FIG. 3. In some embodiments, the single pad has an oval shape, whereas in other embodiments, the single pad has an L-shape, a square shape, or a rectangular shape.

At operation 420, the method continues by adding, or otherwise adjusting, solder material (e.g., solder paste) selectively to the single pad. In some embodiments, adding solder material selectively to the single pad is to produce the same height as the smaller bumps after reflow. In some embodiments, solder material can be added directly to the solder bumps. In some embodiments, solder material can be added using a three-dimensional (3D) printer (e.g., 3D printing the solder material and placing the 3D printed solder material on to the solder bumps). In some embodiments, solder material can be added by (a) placing a stencil (e.g., mask) over a plurality of pads (including the single pads) with an opening exposing (e.g., over) the single pad and (b) applying solder to the single pad exposed by the opening. That is, the solder material can be aimed at the plurality of pads, but the stencil may prevent the solder material from being applied to those pads not exposed by an opening. Advantageously, adjusting solder material volume of the single pad can improve co-planarity (e.g., a custom sized solder bump and standard sized solder bumps can have the same height) and solder profile. FIG. 5A illustrates solder material 501 on a single pad 502, with no solder material on solder pads 503, after operation 420 of the method 400, in accordance with some embodiments.

At operation 430, the method continues by applying solder bumps (e.g., solder balls) to the single pad. In some embodiments, two or more solder bumps are applied to the single pad. In some embodiments, three or more solder bumps are applied to the single pad. In some embodiments, additional solder bumps are applied to additional pads such as the fourth pad 148 of FIG. 1. Each of the additional pads may be for a single (e.g., standard sized) solder bump such as the third solder bump 164 of FIG. 1. In some embodiments, single pad is wider, longer, or wider and longer than each of the additional pads. FIG. 5B illustrates solder material and two instances of the solder bump 504 on the single pad 502 after operation 430 of the method 400, in accordance with some embodiments. In some embodiments, each of the pads 503 also include a solder bump 504

At operation 440, the method continues by reflowing the solder bumps and solder material to produce a custom sized solder bump such as the second solder bump 152 of FIG. 1. In some embodiments, the custom sized solder bump is on a corner of a module such as the module 300 of FIG. 3. In some embodiments, the custom sized solder bump can be oval-shaped, L-shaped, rectangular shaped, or other various shapes. In some embodiments, the custom sized solder bump is wider, longer, or wider and longer than each of the additional solder bumps. In some embodiments, the custom sized bump has a same height as the additional solder bumps. In some embodiments, the custom sized solder bump. FIG. 5C illustrates a single solder bump 506 after operation 430 of the method 400, in accordance with some embodiments.

In some embodiments, after reflowing, a portion of the custom sized solder bump is removed. In some embodiments, the portion of the larger bump is removed by laser ablation (e.g., photoablation) which includes irradiating the larger bump with a laser beam.

Specific details were given in the description to provide a thorough understanding of example embodiments. However, it will be understood by one of ordinary skill in the art that example embodiments may be practiced without these specific details. In other instances, well-known circuits, processes, algorithms, structures, and techniques may be shown without unnecessary detail in order to avoid obscuring example embodiments.

While illustrative embodiments have been described in detail herein, it is to be understood that inventive concepts may be otherwise variously embodied and employed, and that the appended claims are intended to be construed to include such variations, except as limited by the prior art.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

What is claimed is:

1. A device, comprising:
   a circuit board comprising a first surface extending in a first lateral direction and a second lateral direction perpendicular to the first lateral direction; and
   a module comprising:
      a bottom surface extending in the first lateral direction and the second lateral direction perpendicular to the first lateral direction;
      a side surface extending in a vertical direction perpendicular to the first lateral direction and the second lateral direction;
      a first solder bump disposed on the bottom surface, wherein the first solder bump has a first lateral length in the first lateral direction; and
      a second solder bump disposed on the bottom surface, wherein the second solder bump has a second lateral length in the first lateral direction, wherein the first lateral length is greater than the second lateral length, wherein the second solder bump is adjacent to the side surface, wherein the first solder bump and the second solder bump are disposed between the first surface and a second surface of the module and the first solder bump is oval-shaped, rectangular shaped, or L-shaped, wherein the first solder bump is formed from two or more solder bumps;
   a first component disposed on the bottom surface; and
   the second surface being a top surface opposite the bottom surface, wherein a silicon die is disposed on the top surface.

2. The device of claim 1, wherein the bottom surface has first pads, the first pads having a first area and third solder bumps disposed on the first pads;
   wherein the module has a first layer having a second pad, wherein the second pad has a second area greater than the first area and extends across a third lateral length overlapping the first pads, the first pads being coupled to the second pad by vias provides through the first layer, wherein a third solder bump is disposed on the bottom surface, wherein the third solder bump is disposed on the second pad, wherein a third pad is coupled to the second pad and the third lateral length is greater than a total of lateral lengths of the first pads, and wherein a
   a fourth solder bump disposed on the bottom surface, wherein the fourth solder bump has a fourth lateral length in the first lateral direction, wherein the third lateral length is greater than the fourth lateral length, wherein the fourth solder bump is adjacent to the side surface.

3. The device of claim 1, wherein the module includes a first edge, a second edge opposite the first edge, and a first distance from the first edge to the second edge, wherein the first solder bump is a second distance from the first edge, and wherein the second distance is less than 5% of the first distance.

4. The device of claim 1, further comprising a second component disposed on the bottom surface, wherein the first component and the second component are spaced from each other by a distance less than two times the second lateral length, wherein the first solder bump is disposed in between the first component and the second component.

5. The device of claim 1, wherein the first solder bump has a first height in the vertical direction perpendicular to the first lateral direction and the second lateral direction, wherein the second solder bump has a second height in the vertical direction, wherein the first height is equal to the second height.

6. The device of claim 1, the module further comprising a first via extending in the vertical direction to contact a first portion of the first solder bump, a second via extending along the vertical direction to contact a second portion of the first solder bump, wherein the first via is separated from the second via by a distance in the first lateral direction, wherein the vertical direction is perpendicular to the first lateral direction and the second lateral direction.

7. The device of claim 1, wherein the at least one of the first solder bump or the second solder bump is formed by adding solder material to a single pad, applying a pair of third solder bumps, and reflowing the solder material and the pair of third solder bumps to produce a merged solder bump.

8. The device of claim 7, wherein adding the solder material to the single pad comprises three-dimensional (3D) printing the solder material.

9. The module of claim 1, further comprising
a first conductive structure electrically coupling the first solder bump to the silicon die; and
a second conductive structure electrically coupling the second solder bump to the silicon die.

10. The module of claim 1, wherein the first lateral length is at least two times the second lateral length.

11. A device for coupling to a circuit board comprising a first surface extending in a first lateral direction and a second lateral direction perpendicular to the first lateral direction, the device comprising:
a structure comprising:
a second surface extending in the first lateral direction and the second lateral direction, wherein the second surface is disposed over the first surface;
a merged solder bump disposed between the first surface and the second surface, wherein the merged solder bump is one or more of oval-shaped, rectangular shaped, or L-shaped, wherein the merged solder bump is formed from two or more solder bumps;
a first component disposed on the second surface; and
a third surface opposite the second surface, wherein a silicon die is disposed on the third surface.

12. The device of claim 11, wherein the structure is configured so that an air gap is disposed in between the first surface and the second surface.

13. The device of claim 11, wherein the structure comprises a first edge, a second edge opposite the first edge, and a first distance from the first edge to the second edge, wherein the merged solder bump is a second distance from the first edge, and wherein the second distance is less than 5% of the first distance.

14. The device of claim 11, wherein the structure comprises a first edge, wherein no intervening solder bump is disposed in between the first edge and the merged solder bump.

15. The device of claim 11, wherein the structure comprises a second solder bump disposed between the first surface and the second surface, wherein the merged solder bump has a length in the first lateral direction, wherein the second solder bump has a diameter in the first lateral direction, wherein the length is greater than the diameter.

16. A device for coupling to a circuit board comprising a first surface extending in a first lateral direction and a second lateral direction perpendicular to the first lateral direction, the device comprising:
a module comprising:
a second surface extending in the first lateral direction and the second lateral direction, wherein the second surface is disposed over the first surface;
a merged solder bump disposed between the first surface and the second surface, wherein the merged solder bump is one or more of oval-shaped, rectangular shaped, or L-shaped, wherein the circuit board comprises a first pad for a first solder bump and a second pad for a second solder bump merged into a single pad for the merged solder bump, wherein the merged solder bump is formed by adding solder material to the single pad, applying the first solder bump and the second solder bump, and reflowing the solder material and the first solder bump and the second solder bump to produce the merged solder bump; and
a first component disposed on the second surface; and
a third surface opposite the second surface, wherein a silicon die is disposed on the third surface.

17. The device of claim 16, wherein adding the solder material to the single pad comprises placing a stencil over the first pad and the second pad, wherein the stencil includes an opening exposing the single pad, and applying solder to the single pad exposed by the opening.

18. The device of claim 16, wherein adding the solder material to the single pad comprises three-dimensional (3D) printing the solder material.

19. The device of claim 16, wherein a portion of the merged solder bump is removed using laser ablation.

* * * * *